(12) United States Patent
Chi

(10) Patent No.: US 9,397,640 B2
(45) Date of Patent: Jul. 19, 2016

(54) LATCH CIRCUIT AND SEMICONDUCTOR DEVICE INCLUDING THE SAME

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/546,760

(22) Filed: Nov. 18, 2014

(65) Prior Publication Data
US 2016/0019938 A1    Jan. 21, 2016

(30) Foreign Application Priority Data

Jul. 21, 2014  (KR) .................. 10-2014-0091868

(51) Int. Cl.
*G11C 7/10* (2006.01)
*H03K 3/356* (2006.01)
*G11C 11/412* (2006.01)

(52) U.S. Cl.
CPC ...... *H03K 3/356104* (2013.01); *G11C 11/4125* (2013.01)

(58) Field of Classification Search
CPC .. G11C 7/1051; G11C 7/1078; G11C 11/412; G11C 11/413
USPC ............................................ 365/189.05, 154
See application file for complete search history.

(56) References Cited

U.S. PATENT DOCUMENTS

| 7,321,506 | B2 * | 1/2008 | Roche .................. | H03K 3/0375 365/154 |
| 8,178,903 | B2 | 5/2012 | Nakamura | |
| 2005/0056876 | A1 * | 3/2005 | Miyatake ................. | G11C 7/18 257/296 |
| 2013/0322183 | A1 * | 12/2013 | Jeong ...................... | G11C 8/00 365/189.05 |

FOREIGN PATENT DOCUMENTS

KR    1020120126439    11/2012

* cited by examiner

*Primary Examiner* — Huan Hoang
(74) *Attorney, Agent, or Firm* — IP & T Group LLP

(57) ABSTRACT

A latch circuit includes: first to Nth storage nodes where N is an even number equal to or more than four; and first to Nth pairs of transistors, each of which comprises a PMOS transistor and an NMOS transistor coupled in series with each other through a corresponding node among the first to Nth storage nodes. The PMOS transistor is coupled to one of the storage nodes included in previous one of the pairs of transistors at a gate of the PMOS transistor. The NMOS transistor is coupled to one of the storage nodes included in next one of the pairs of transistors at a gate of the NMOS transistor. The PMOS transistors of the first to Nth pairs of transistors are formed in a first active region. The NMOS transistors of the first to Nth pairs of transistors are formed in a second active region, separated from the first active region.

19 Claims, 11 Drawing Sheets

LATCH CIRCUIT AND SEMICONDUCTOR DEVICE INCLUDING THE SAME

CROSS-REFERENCE TO RELATED APPLICATIONS

The present application claims priority of Korean Patent Application No. 10-2014-0091868, filed on Jul. 21, 2014, which is incorporated herein by reference in its entirety.

BACKGROUND

1. Field

Various exemplary embodiments of the present invention relate to a latch circuit and a semiconductor device including the same.

2. Description of the Related Art

With the increase in integration degree of semiconductor devices and the decrease in size of transistors, the quantity of electric charge that can be stored in the transistor has gradually decreased. Thus, data stored in a latch or the like of the semiconductor device may be influenced by alpha particle collisions or cosmic rays. For example, when alpha particles collide with the semiconductor device, a cloud of hole-electron pairs are generated around paths of the alpha particles passing through the semiconductor material. The generated holes and electrons are transferred to electric fields existing in the semiconductor device. The polarity of a node of the latch, in which an electric charge is stored, may be changed by the transfer of the holes and electrons, and the data stored in the latch may be inverted. This phenomenon in which data stored in the latch is changed by alpha particle collisions or cosmic rays is referred to as a soft error, and the frequency of soft errors has increased to such a level that it is affecting the reliability of the entire semiconductor device.

A conventional memory device stores an address corresponding to a defective part of a cell array in a fuse circuit, and compares the address stored in the fuse circuit to an address which is inputted to the memory device that designates a position to be accessed in the memory device, in order to control a repair operation of the memory device. The repair operation replaces part of the cell array where a defect has occurred with a normally functioning part of the cell array. Conventionally, a laser fuse has been used to store defective addresses. Laser fuses store high or low data according to whether a fuse is cut. The laser fuse can be programmed at a wafer level, but cannot be programmed after the wafer is mounted in a package. Furthermore, due to pitch, laser fuses have limits in how small they are capable of being designed.

In order to solve this problem, a nonvolatile memory circuit such as an E-fuse array circuit (ARE), NAND flash memory, NOR flash memory, EPROM (Erasable Programmable Read Only Memory), EEPROM (Electrically Erasable Programmable Read Only Memory), FRAM (Ferroelectric RAM), and MRAM (Magneto-resistive RAM) may be included in the memory device, and repair information may be stored in the nonvolatile memory circuit.

FIG. 1 is a block diagram illustrating a memory device using a non-volatile memory circuit to store repair information according to prior art.

Referring to FIG. 1, the memory device includes a plurality of memory banks BK0 to BK3, a plurality of latch sets 110_0 to 110_3 provided for the respective memory banks BK0 to BK3 to store repair information, a latch set 110_4 for storing setting information, a setting circuit 120, and a nonvolatile memory circuit 101.

The nonvolatile memory circuit 101 replaces a conventional fuse circuit, and stores repair information, i.e., repair addresses, corresponding to all of the banks BK0 to BK3. Furthermore, the nonvolatile memory circuit 101 stores setting information required for operation of the memory device. The nonvolatile memory circuit may be one among an e-fuse array circuit, a NAND flash memory, a NOR flash memory, an Erasable Programmable Read Only Memory (EPROM), an Electrically Erasable Programmable Read Only Memory (EEPROM), a Ferroelectric Random Access Memory (FRAM) and a Magnetoresistive Random Access Memory (MRAM).

The latch sets 110_0 to 110_3 provided for the respective banks BK0 to BK3 store repair information of the memory banks corresponding thereto. The latch set 110_0 stores the repair information of the memory bank BK0, and the latch set 110_2 stores the repair information of the memory bank BK2. Furthermore, the latch set 110_3 stores setting information to be used for the setting circuit 120. The setting circuit 120 may set various setting values required for an operation of the memory device, for example, an internal voltage level and various latencies, using the setting information stored in the latch set 110_3. The latch sets 110_0 to 110_4 may store the repair information only while power is supplied. The repair information to be stored in the latch sets 110_0 to 110_4 may be received from the nonvolatile memory circuit 101. The nonvolatile memory circuit 101 transmits the stored repair information to the latch sets 110_0 to 110_3 when a boot-up signal BOOTUP is enabled.

Since the nonvolatile memory circuit 101 is configured in an array, a certain amount of time is required to load data stored in the nonvolatile memory circuit 101, and thus data cannot be immediately loaded, and the data stored in the nonvolatile memory circuit 101 cannot be directly used to perform a repair operation. Thus, the repair information and the setting information stored in the nonvolatile memory circuit 101 is transmitted and stored into the latch sets 110_0 to 110_4, and the data stored in the latch sets 110_0 to 110_4 is used for the repair operations of the memory banks BK0 to BK3 and the setting operation of the setting circuit 120. The operation of transmitting the repair information and the setting information from the nonvolatile memory circuit 101 to the latch sets 110_0 to 110_4 is referred to as a boot-up operation. Only when a boot-up operation is completed may the memory device repair a failed cell and perform various setting operations. Then, the memory device may start a normal operation.

Memory devices may have a large number of latches for executing repair operations. Since there are many latches, soft errors may have a large influence on the reliability of repair operations within a memory device. In addition, since latches are used as memory cells in a semiconductor device such as SRAM, the reliability of these devices may also be affected by soft errors.

SUMMARY

Various embodiments are directed to a latch circuit that is resistant to soft errors and a semiconductor device including the same.

In an embodiment, a latch circuit may include: first to Nth storage nodes where N is an even number equal to or more than four; and first to Nth pairs of transistors, each of which comprises a PMOS transistor and an NMOS transistor coupled in series through a corresponding node among the first to Nth storage nodes. The PMOS transistor may be coupled to one of the storage nodes included in a previous one of the pairs of transistors at a gate of the PMOS transistor. The NMOS transistor may be coupled to one of the storage nodes included in a next one of the pairs of transistors at a gate of the NMOS transistor. The PMOS transistors of the first to Nth pairs of transistors may be formed in a first active region. The NMOS transistors of the first to Nth pairs of transistors may be formed in a second active region separated from the first active region.

In an embodiment, a latch circuit may include: first to Nth PMOS transistors formed in a first active region, and sequentially arranged in one of the clockwise and counterclockwise directions, where N is an even number equal to or more than four; and first to Nth NMOS transistors formed in a second active region separated from the first active region, and sequentially arranged in one of the clockwise and counterclockwise directions. A Kth PMOS transistor and a Kth NMOS transistor may be coupled in series to each other, and a node coupled to the Kth PMOS and NMOS transistors may be coupled to the gate of a (K−1)th NMOS transistor and the gate of a (K+1) PMOS transistor, where 1≤K≤N.

In an embodiment, a latch circuit may include: first to fourth PMOS transistors formed in a first active region and arranged at each corner of a rectangle; and first to fourth NMOS transistors formed in a second active region separated from the first active region, and arranged at each corner of a rectangle. The first and third PMOS transistors and the first and third NMOS transistors may be arranged in diagonal directions, respectively, a Kth PMOS transistor and a Kth NMOS transistor may be coupled in series to each other, and a node coupled to the Kth PMOS and NMOS transistors may be coupled to the gate of a (K−1)th NMOS transistor and the gate of a (K+1)th PMOS transistor, where 1≤K≤N.

In an embodiment, a semiconductor device may include: a nonvolatile memory unit; a data bus suitable for transmitting data outputted from the nonvolatile memory unit; a selection signal generation unit suitable for generating a plurality of selection signals; and a plurality of latch sets activated in response to corresponding selection signals among the plurality of selection signals, suitable for storing data transmitted to the data bus, and each comprising a plurality of latch circuits. Each of the latch circuits may include: first to fourth Nth storage nodes where N is an even number equal to or more than four; and first to Nth pairs of transistors, each of which comprises a PMOS transistor and a NMOS transistor coupled in series with each other through a corresponding node of the first to Nth storage nodes. The PMOS transistor may be coupled to one of the storage nodes included in a previous one of the pairs of transistors at a gate of the PMS transistor. The NMOS transistor may be coupled to one of the storage nodes included in a next one of the pairs of transistors at a gate of the NMOS transistor. The PMOS transistors of the first to Nth pairs of transistors may be formed in a first active region. The NMOS transistors of the first to Nth pairs of transistors may be formed in a second active region separated from the first active region.

DETAILED DESCRIPTION

Figure 1:
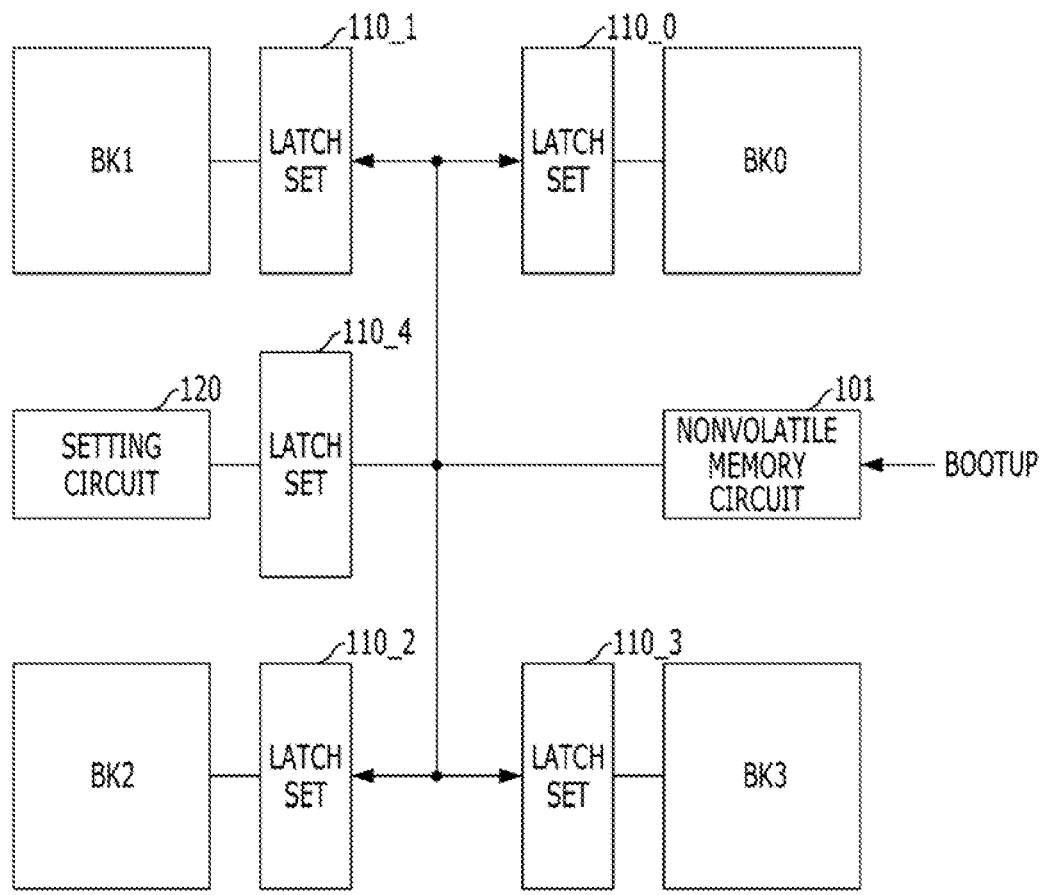
FIG. 1 is a block diagram illustrating a memory device using a non-volatile memory circuit to store repair information according to prior art.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
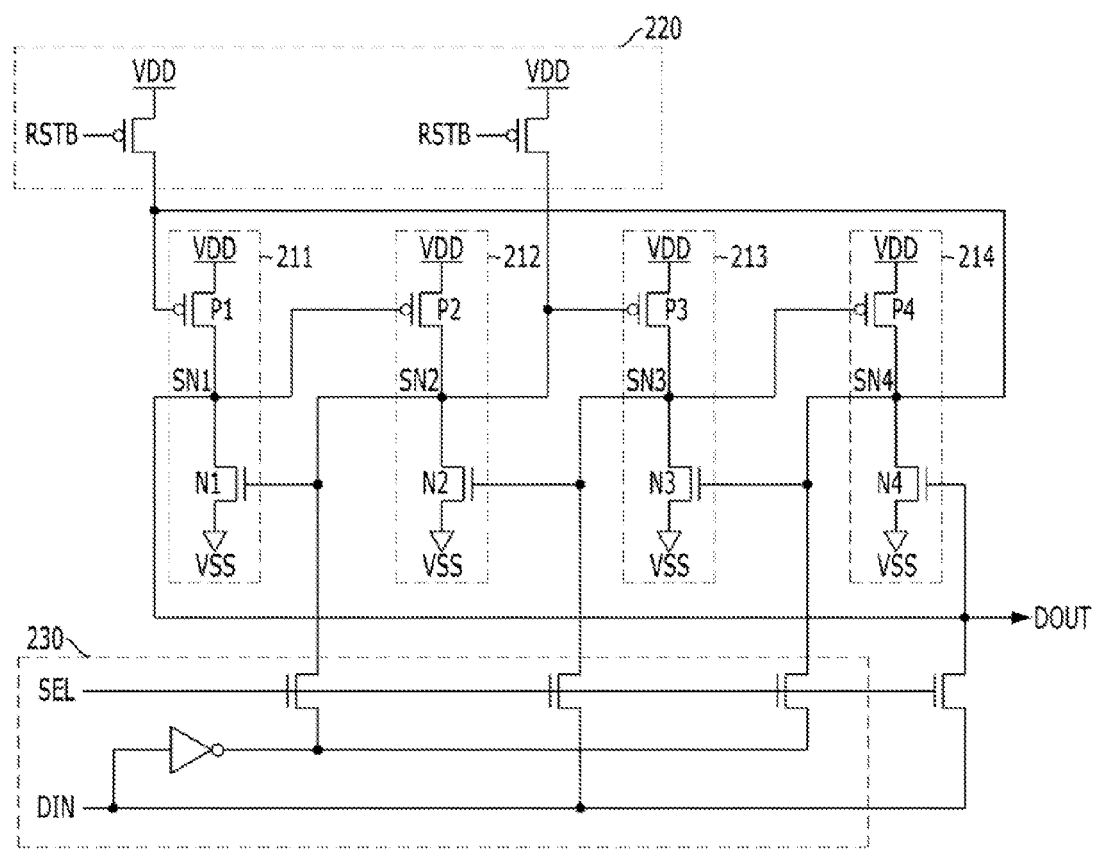
FIG. 2 is a circuit diagram exemplarily illustrating a latch circuit in accordance with an exemplary embodiment of the present invention.

FIG. 2 is a circuit diagram exemplarily illustrating a latch circuit in accordance with an exemplary embodiment of the present invention.

Referring to FIG. 2, the latch circuit may include first to fourth storage nodes SN1 to SN4, first to fourth pairs of transistors 211 to 214, an initialization unit 220, and a data input control unit 230.

The pairs of transistors 211 to 214 may include PMOS transistors P1 to P4 and NMOS transistors N1 to N4, which are coupled in series at corresponding storage nodes SN1 to SN4, respectively. Gates of the NMOS transistor of the previous one of the first to fourth pairs of transistors 211 to 214 and the PMOS transistor of the next one of the first to fourth pairs of transistors 211 to 214 may be coupled at one of the storage nodes SN1 to SN4 included in the current one of the first to fourth pairs of transistors 211 to 214. For example, the gates of the NMOS transistor N1 of the first pair of transistors 211 and the PMOS transistor P3 of the third pair of transistors 213 may be coupled at the second storage node SN2. The next one of the last pair of transistors 214 may be the first pair of transistors 211. Similarly, the previous one of the first pair of transistors 211 may be the last pair of transistors 214.

The initialization unit 220 may initialize voltages of two or more nodes among the storage nodes SN1 to SN4 in response to an initialization signal RSTB which is enabled when data of the latch circuit is initialized. The initialization signal RSTB may be an inverted signal of the initialization signal RST. Due to the characteristics of the latch circuit, the data stored in the latch circuit may be changed only when the voltages of two or more nodes among the storage nodes SN1 to SN4 are changed at the same time. Thus, the initialization unit 220 may initialize the latch circuit by applying a voltage to two or more nodes among the storage nodes SN1 to SN4 at the same time, preferably two or more even-numbered nodes or two or more odd-numbered nodes. FIG. 2 illustrates that the initialization unit 220 initializes the data stored in the latch circuit by applying a power supply voltage VDD to the even-numbered storage nodes SN2 and SN4 when the initialization signal RSTB is enabled. However, the initialization unit 220 may initialize the latch circuit in various ways. For example, the initialization unit 220 may initialize the value stored in the latch circuit by applying a ground voltage VSS to the even-numbered storage nodes SN2 and SN4, or to the odd-numbered storage nodes SN1 and SN3, or it may initialize the value stored in the latch circuit by applying the power source voltage VDD to the odd-numbered storage nodes SN1 and SN3.

The data input control unit 230 may transmit data of a data input line DIN to the storage nodes SN1 to SN4 when a selection signal SEL is enabled. The data input control unit 230 may transmit the data of the data input line DIN to the odd-numbered nodes SN1 and SN3, and invert and transmit the data of the data input line DIN to the even-numbered nodes SN2 and SN4. That is because the odd-numbered storage nodes SN1 and SN3 have opposite polarity to the even-numbered storage nodes SN2 to SN4. It is exemplarily shown that the data input control unit 230 transmits the data of the data input line DIN to the storage nodes SN1 to SN4 when the selection signal SEL is enabled, which may vary. As another example, the data input control unit 230 may transmit the data of the data input line DIN to two or more nodes among the storage nodes SN1 to SN4, preferably two or more even-numbered nodes or two or more odd-numbered nodes.

The data of the storage node SN1 among the storage nodes SN1 to SN4 may be provided to the output DOUT of the latch circuit. Although it is exemplarily described in the embodiment that the data of the storage node SN1 is provided to the output DOUT of the latch circuit, it is obvious that the data of any node among the storage nodes SN1 to SN4 may be provided to the output DOUT of the latch circuit.

The latch circuit illustrated in FIG. 2 is resistant to soft errors caused by cosmic rays. Only when two or more nodes among the storage nodes SN1 to SN4 simultaneously change due to cosmic rays may the data stored in the latch circuit be corrupted by an error caused by cosmic rays. For example, although the data of the first storage node SN1 changes from 1 to 0 due to the cosmic rays when the data set '1, 0, 1, 0' is stored in the storage nodes SN1 to SN4, the data of the first storage node SN1 may change from 0 to 1 due to the PMOS transistor P1. In other words, the soft error does not occur unless the data of two or more storage nodes in the latch circuit simultaneously change. The probability of simultaneous data change in two or more storage nodes due to cosmic rays is extremely low.

Although it is exemplarily described in the embodiment of FIG. 2 that the latch circuit includes four pairs of transistors 211 to 214 and four storage nodes SN1 to SN4, the latch circuit may include N number of pairs of transistors and N number of storage nodes, where N is an even number greater than 4. For example, the latch circuit may include 6 pairs of transistors and 6 storage nodes. For reference, the power supply voltage VDD may include a voltage corresponding to a high level, and the ground voltage VSS may include a voltage corresponding to a low level.

Figure 3:
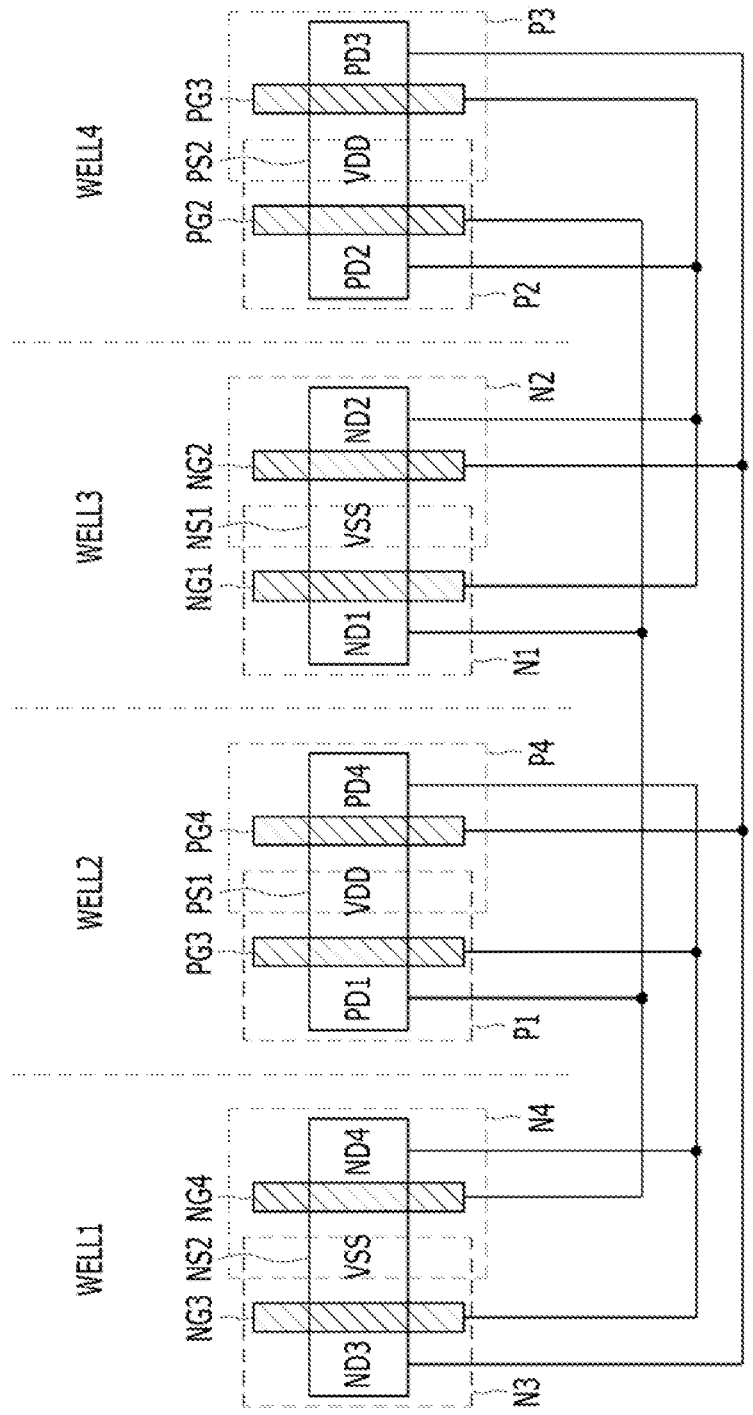
FIG. 3 is a layout exemplarily illustrating transistors P1 to P4 and N1 to N4 in a latch circuit of FIG. 2.

FIG. 3 is a layout exemplarily illustrating the transistors P1 to P4 and N1 to N4 in the latch circuit of FIG. 2.

Referring to FIG. 3, the transistors N3 and N4 may be formed in a first well region WELL1, the transistors P1 and P4 may be formed in a second well region WELL2, the transistors N1 and N2 may be formed in a third well region WELL3, and the transistors P2 and P3 may be formed in a fourth well region WELL4. The first and third well regions WELL1 and WELL3 may correspond to P-well regions doped with a P-type semiconductor, and the second and fourth well regions WELL2 and WELL4 may correspond to N-well regions doped with an N-type semiconductor. The pairs of transistors N1 and N2, N3 and N4, P1 and P4, and P2 and P3, which are formed in the same well region, may share sources NS1, NS2, PS1, and PS2, respectively.

The drain PD1 of the transistor P1, the drain ND1 of the transistor N1, the gate PG2 of the transistor P2, and the gate NG4 of the transistor N4 may be coupled to each other. The drain PD2 of the transistor P2, the drain ND2 of the transistor N2, the gate PG3 of the transistor P3, and the gate NG1 of the transistor N1 may be coupled to each other. The drain PD3 of the transistor P3, the drain ND3 of the transistor N3, the gate PG4 of the transistor P4, and the gate NG2 of the transistor N2 may be coupled to each other. The drain PD4 of the transistor P4, the drain ND4 of the transistor N4, the gate PG1 of the transistor P1, and the gate NG3 of the transistor N3 may be coupled to each other.

Figure 4:
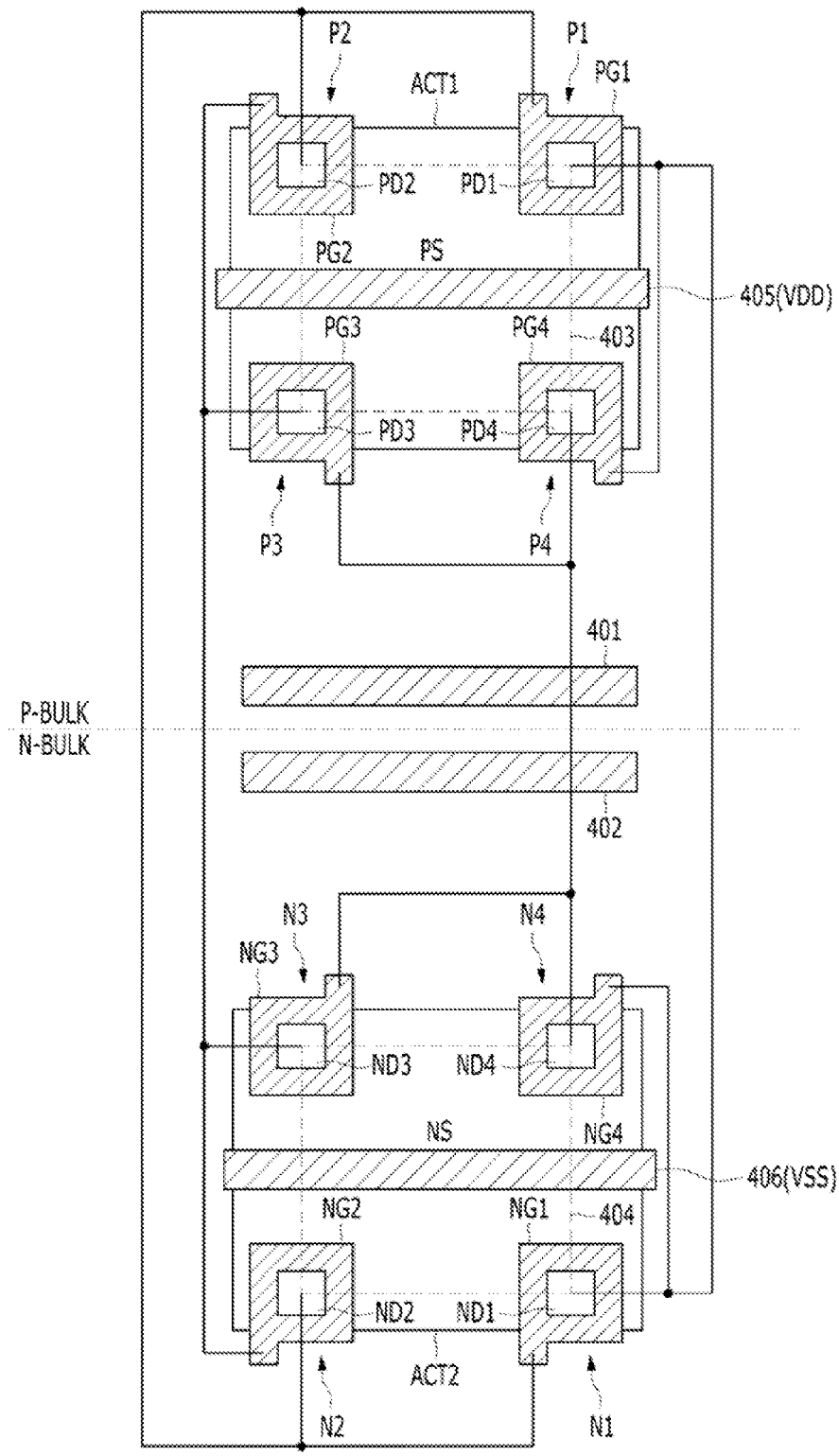
FIG. 4 is a layout exemplarily illustrating transistors P1 to P4 and N1 to N4 in a latch circuit of FIG. 2.
Figure 5A:
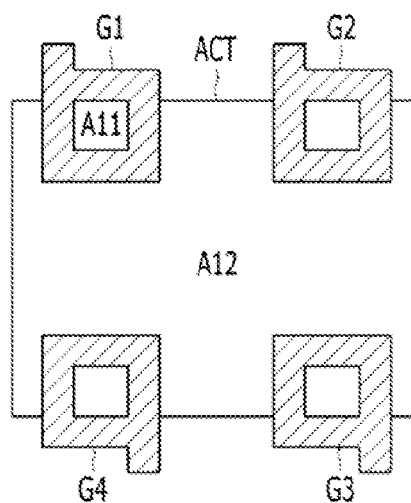
FIGS. 5A to 5D are layouts exemplarily illustrating various examples of gates of transistors P1 to P4 and N1 to N4 of FIG. 4.
Figure 5B:
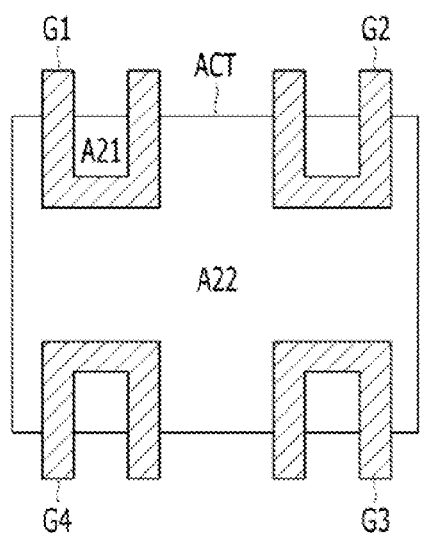
Figure 5C:
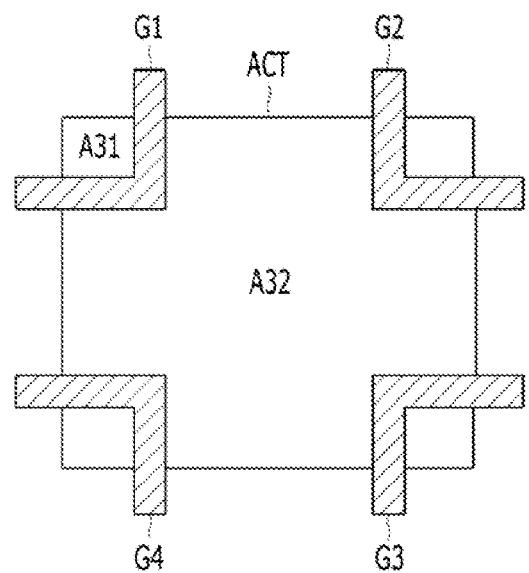
Figure 5D:
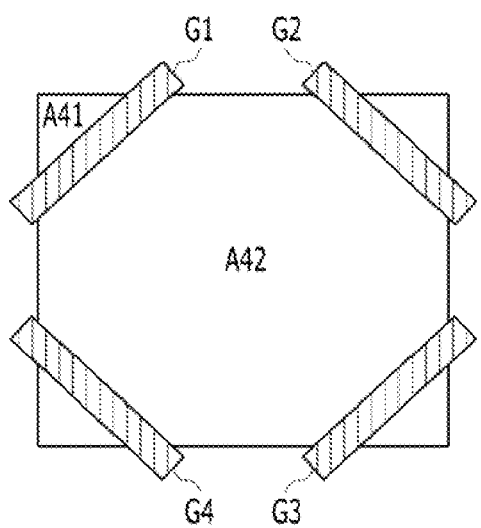

FIG. 4 is a layout exemplarily illustrating the transistors P1 to P4 and N1 to N4 in the latch circuit of FIG. 2.

Referring to FIG. 4, the PMOS transistors P1 to P4 may be formed in a first active region ACT1, and the NMOS transistors N1 to N4 may be formed in a second active region ACT2. The first active region ACT1 and the second active region ACT2 may be separated from each other. The first active region ACT1 may be a P-bulk doped with P-type semiconductor, and the second active region ACT2 may be an N-bulk doped with an N-type semiconductor. The N-bulk and the P-bulk may receive a power supply voltage VDD or ground voltage VSS through bulk voltage lines 401 and 402, respectively.

The PMOS transistors P1 to P4 may be sequentially arranged in one of the clockwise and counterclockwise directions in the first active region ACT1, and the NMOS transistors N1 to N4 may be sequentially arranged in one of the clockwise and counterclockwise directions in the second active region ACT2. FIG. 4 illustrates that the PMOS transistors P1 to P4 are sequentially arranged in the counterclockwise direction in the first active region ACT1 and the NMOS transistors N1 to N4 are sequentially arranged in the clockwise direction in the second active region ACT2.

Furthermore, the PMOS transistors P1 to P4 may be sequentially arranged and may have a polygonal shape in the first active region ACT1, and the NMOS transistors N1 to N4 may be sequentially arranged in one of the clockwise and counterclockwise directions and may have a polygonal shape in the second active region ACT2. FIG. 4 illustrates that the PMOS transistors P1 to P4 and the NMOS transistors N1 to N4 are arranged in a rectangular shape. In particular, the transistors P1 to P4 may be sequentially arranged in one of the clockwise and counterclockwise directions at the corners of a rectangle 403, and the transistors N1 to N4 may be sequentially arranged at the corners of a rectangle 404.

In the first active region ACT1, based on such an arrangement, the PMOS transistors P1 and P2, P1 and P4, P2 and P3, or P3 and P4 coupled to storage nodes having different polarities from each other, among the PMOS transistors P1 to P4, may be arranged adjacent to each other, and the PMOS transistors P1 and P3 or P2 and P4 coupled to storage nodes having the same polarity may be arranged in a diagonal direction. Furthermore, in the second active region ACT2, the NMOS transistors N1 and N2, N1 and N4, N2 and N3, or N3 and N4 coupled to storage nodes having different polarities from each other, among the NMOS transistors N1 to N4, may be arranged adjacent to each other, and the NMOS transistors N1 and N3 or N2 and N4 coupled to storage nodes having the same polarity may be arranged in a diagonal direction.

The PMOS transistors P1 to P4 arranged in the first active region ACT1 may share a single node to which the power supply voltage VDD is applied. In the first active region ACT1, the power supply voltage VDD may be applied to the part PS shared by the PMOS transistors P1 to P4 through a power supply voltage line 405. The NMOS transistors N1 to N4 arranged in the second active region ACT2 may share a single node to which the ground voltage VSS is applied. In the second active region ACT2, the ground voltage VSS may be applied to the part NS shared by the NMOS transistors N1 to N4 through a ground voltage line 406.

The PMOS transistors P1 to P4 may have gates PG1 to PG4, respectively, each of which divides the first active region ACT1 into two different regions, and the NMOS transistors N1 to N4 may have gates N1 to N4, respectively, each of which divides the second active region ACT2 into two different regions. The active regions divided by the gates PG1 to PG4 and NG1 to NG4 of the respective transistors may become the drains PD1 to PD4 and ND1 to ND4 and the sources PS and NS of the corresponding transistors.

The drain PD1 of the transistor P1, the drain ND1 of the transistor N1, the gate PG2 of the transistor P2, and the gate NG4 of the transistor N4 may be coupled to each other. The drain PD2 of the transistor P2, the drain ND2 of the transistor N2, the gate PG3 of the transistor P3, and the gate NG1 of the transistor N1 may be coupled to each other. The drain PD3 of the transistor P3, the drain ND3 of the transistor N3, the gate PG4 of the transistor P4, and the gate NG2 of the transistor N2 may be coupled to each other. The drain PD4 of the transistor P4, the drain ND4 of the transistor N4, the gate PG1 of the transistor P1, and the gate NG3 of the transistor N3 may be coupled to each other.

FIG. 4 illustrates that the gates PG1 to PG4 or NG1 to NG4 have a ring shape or rectangular ring shape. However, each of the gates PG1 to PG4 and NG1 to NG4 may have a shape or arrangement that divides the corresponding active region into two different regions. Various embodiments of the gates PG1 to PG4 and NG1 to NG4 will be described below with reference to FIG. 5.

FIGS. 5A to 5D are layouts exemplarily illustrating various examples of the gates of the transistors P1 to P4 and N1 to N4 of FIG. 4.

In FIGS. 5A to 5D, an active region ACT may correspond to one of the first and second active regions ACT1 and ACT2, and first to fourth gates G1 to G4 may correspond to the gates PG1 to PG4 of the PMOS transistors P1 to P4 and the gates N1 to N4 of the NMOS transistors N1 to N4.

As described above with reference to FIG. 4, each of the gates G1 to G4 may have such a shape that divides the active region ACT into two different regions. As can be seen from the top of each of the gates G1 to G4 in FIG. 4, the active region ACT is divided into two different regions which are not connected to each other.

The first example A illustrates that each of the gates G1 to G4 has a ring shape. In the first example A, the active region ACT may be divided into the internal region of the gate and the external region of the gate, based on each of the gates G1 to G4. For example, based on the first gate G1, the active region ACT may be divided into an internal region A11 and an external region A12.

The second example B illustrates that each of the gates G1 to G4 has a U-shape. In the second example B, the active region ACT may be divided into two regions, based on each of the gates G1 to G4. For example, based on the first gate G1, the active region ACT may be divided into a first region A21 and a second region A22.

The third example C illustrates that each of the gates G1 to G4 has an L-shape. In the third example C, the active region ACT may be divided into two regions, based on each of the gates G1 to G4. For example, based on the first gate G1, the active region ACT may be divided into a first region A31 and a second region A32.

The fourth example D illustrates that each of the gates G1 to G4 has a straight line or bar shape. In the fourth example D, the active region ACT may be divided into two regions, based on each of the gates G1 to G4. For example, based on the first gate G1, the active region ACT may be divided into a first region A41 and a second region A42.

Since the first to fourth transistors P1 to P4 or N1 to N4 share the source, and the gates thereof have the above-described shapes, the area of the active region required for forming the transistors may be reduced in comparison to the first to fourth transistors P1 to P4 or N1 to N4 of FIG. 3.

Figure 6:
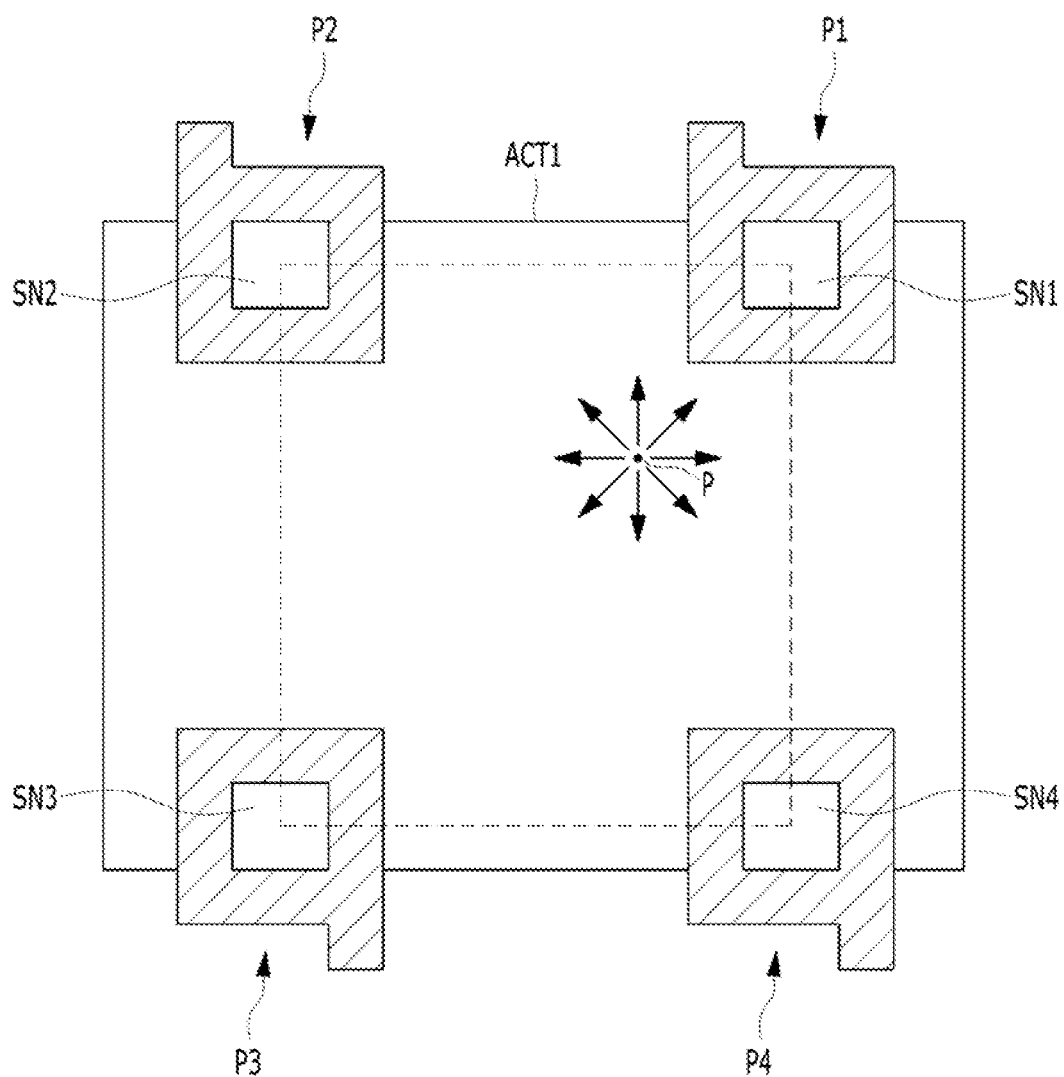
FIG. 6 is a layout illustrating a self-canceling effect of a latch circuit of FIG. 4.

FIG. 6 is a layout exemplarily illustrating the self-canceling effect of the latch circuit of FIG. 4. FIG. 6 illustrates the first active region ACT1 and the first to fourth PMOS transistors P1 to P4.

Referring to FIG. 6, suppose that an alpha particle collides with one point P in the rectangle 403 of the first active region ACT1. At this time, the electric charge generated by the alpha particle collision or cosmic ray incidence may diffuse in all directions (arrow directions) from the collision point P. Thus, the generated electric charge may change the quantity of electric charge of the first to fourth storage nodes SN1 to SN4 in the same direction (for example, +charge increase or −charge increase). When all the quantities of electric charge stored in the first to fourth storage nodes SN1 to SN4 are changed in the same direction, a difference between the quantities of electric charge stored in the nodes SN1 and SN3 or SN2 and SN4, having different polarities, the difference in potential between the nodes may be maintained. Thus, the data stored in the latch circuit ford not invert but remains the same.

For example, suppose that the voltages of the storage nodes SN1 to SN4 are 1V, 0V, 1V, and 0V, respectively. At this time, suppose that the voltages of the storage nodes SN1 to SN4 were increased by 0.5V through an electric charge generated by alpha particle collision or cosmic ray incidence. In this case, the voltages of the storage nodes SN1 to SN4 become 1.5V, 0.5V, 1.5V, and 0.5V. Although the potentials of the storage nodes SN1 to SN4 is increased, the difference in potential between the storage nodes having different polarities is a constant of 1V. Thus, the data stored in the storage nodes may be stably maintained.

That is, the influence caused by the electric charge generated through the alpha particle collision or cosmic ray incidence may be offset by the arrangement of the transistors as well as the structure of the latch circuit. Furthermore, although alpha particle collisions or cosmic ray incidences simultaneously occur at one point of the first active region ACT1 or the second active region ACT2, the influence caused by electric charge generated by the alpha particle collisions or cosmic ray incidences may also be offset. In the latch circuit of FIG. 3, when alpha particle collisions or cosmic ray incidences simultaneously occur in the storage nodes having the same polarity, soft errors may still occur. For example, when alpha particle collisions or cosmic ray incidences simultaneously occur between the drains PD2 and ND2 and between the drains PD4 and ND4, soft errors may occur.

In the latch circuit of FIG. 4, the transistors may be arranged in such a manner that all the storage nodes SN1 to SN4 receive the influence of generated electric charges, regardless of the point at which alpha particle collision or cosmic ray incidence occurs. Therefore, the latch circuit may be much more resistant to soft errors.

Referring to FIGS. 2 and 4, the latch circuit in accordance with the embodiment of the present invention will be described.

Referring to FIG. 4, the latch circuit may include the first to fourth PMOS transistors P1 to P4 and the first to fourth NMOS transistors N1 to N4. The first to fourth PMOS transistors P1 to P4 may be formed in the first active region ACT1 and sequentially arranged in one of the clockwise and counterclockwise directions, and the first to fourth NMOS transistors N1 to N4 may be formed in the second active region ACT2 separated from the first active region ACT1 and sequentially arranged in one of the clockwise and counterclockwise directions. In this configuration, a Kth PMOS transistor PK and a Kth NMOS transistor NK may be coupled in series, and a node SNK coupled to the Kth PMOS and NMOS transistors PK and NK may be coupled to the gate NGK−1 of a (K−1)th NMOS transistor NK−1 and the gate PGK+1 of a (K+1)th PMOS transistor PK+1, where 1≤K≤4.

More specifically, the first PMOS transistor P1 may be coupled in series to the first NMOS transistor N1, and the node SN1 coupled to the first PMOS and NMOS transistors P1 and N1 may be coupled to the gate NG4 of the fourth NMOS transistor N4 and the gate PG2 of the second PMOS transistor P2. The second PMOS transistor P2 may be coupled in series to the second NMOS transistor N2, and the node SN2 coupled to the second PMOS and NMOS transistors P2 and N2 may be coupled to the gate NG1 of the first NMOS transistor N1 and the gate PG3 of the third PMOS transistor P3. The third PMOS transistor P3 may be coupled in series to the third NMOS transistor N3, and the node SN3 coupled to the third PMOS and NMOS transistors P3 and N3 may be coupled to the gate NG2 of the second NMOS transistor N2 and the gate PG4 of the fourth PMOS transistor P3. The fourth PMOS transistor P4 may be coupled in series to the fourth NMOS transistor N4, and the node SN4 coupled to the first PMOS and NMOS transistors P1 and N1 may be coupled to the gate NG4 of the fourth NMOS transistor N4 and the gate PG1 of the first PMOS transistor P1.

The first to fourth PMOS transistors P1 to P4 and the first to fourth NMOS transistors N1 to N4 may be arranged in the first and second active regions ACT1 and ACT2, respectively, in various ways as described above with reference to FIG. 4.

FIG. 4 illustrates that the latch circuit includes four pairs of transistors 211 to 214 and four storage nodes SN1 to SN4. However, the latch circuit may be configured to include N pairs of transistors and N storage nodes where N is an even number equal to or more than four. For example, the latch circuit may be configured to include six or more pairs of transistors and six or more storage nodes.

Referring to FIGS. 2 and 4, the latch circuit in accordance with the embodiment of the present invention will be described.

Referring to FIG. 4, the latch circuit may include the first to fourth PMOS transistors P1 to P4 and the first to fourth NMOS transistors N1 to N4. The first to fourth PMOS transistors P1 to P4 may be formed in the first active region ACT1 and arranged at the respective corners of the rectangle 403, and the first to fourth NMOS transistors N1 to N4 may be formed in the second active region ACT2 separated from the first active region ACT1 and arranged at the respective corners of the rectangle 404. The first and third PMOS transistors P1 and P3 and the first and third NMOS transistors N1 and N3 may be arranged in diagonal directions, respectively, and the second and fourth PMOS transistors P2 and P4 and the second and fourth NMOS transistors N2 and N4 may be arranged in diagonal directions, respectively.

In this configuration, a Kth PMOS transistor PK and a Kth NMOS transistor NK may be coupled in series to each other, and a node SNK coupled to the Kth PMOS and NMOS transistors PK and NK may be coupled to the gate NGK−1 of a (K−1)th NMOS transistor NK−1 and the gate PGK+1 of a (K+1)th PMOS transistor PK+1. The node SN1 coupled to the first PMOS and NMOS transistors P1 and N1 may be coupled to the gate NG4 of the fourth NMOS transistor N4 and the gate PG2 of the second PMOS transistor P2, and the node SN4 coupled to the fourth PMOS and NMOS transistors P4 and N4 may be coupled to the gate NG3 of the third NMOS transistor N3 and the gate PG1 of the first PMOS transistor P1.

Figure 7:
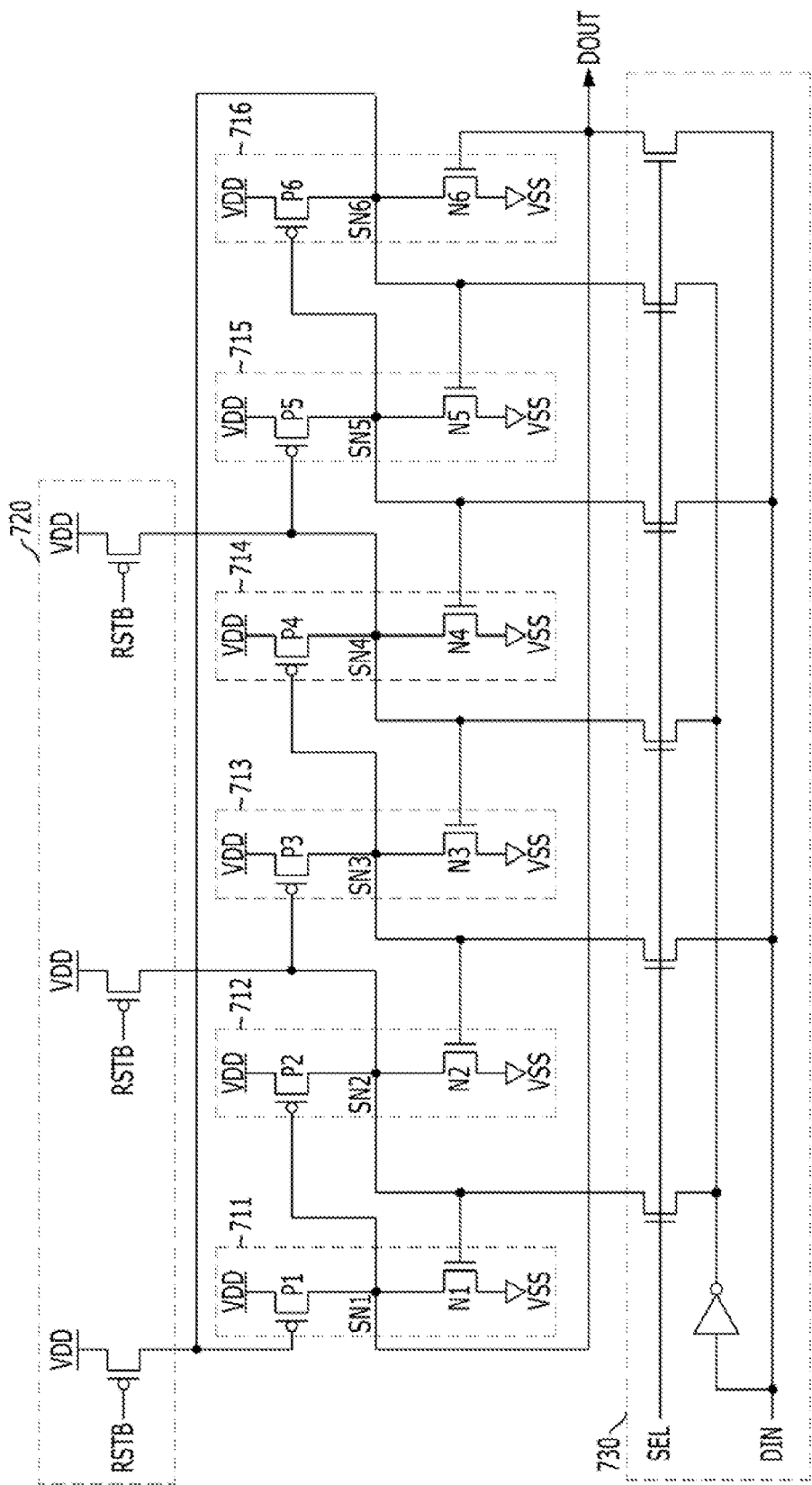
FIG. 7 is a circuit diagram exemplarily illustrating a latch circuit in accordance with an exemplary embodiment of the present invention.

FIG. 7 is a circuit diagram exemplarily illustrating a latch circuit in accordance with an exemplary embodiment of the present invention.

Referring to FIG. 7, the latch circuit may include first to sixth storage nodes SN1 to SN6, first to sixth pairs of transistors 711 to 716, an initialization unit 720, and a data input control unit 730. The latch circuit of FIG. 7 may include six pairs of transistors 711 to 716 and six storage nodes SN1 to SN6, unlike the latch circuit of FIG. 4.

The pairs of transistors 711 to 716 may include PMOS transistors P1 to P6 and NMOS transistors N1 to N6, which are coupled in series at corresponding storage nodes SN1 to SN6. Gates of the NMOS transistor of the previous one of the first to sixth pairs of transistors 711 to 716 and the PMOS transistor of the next one of the first to sixth pairs of transistors 711 to 716 may be coupled at one of the storage nodes SN1 to SN6 included in the current one of the first to sixth pairs of transistors 711 to 716. For example, the gates of the NMOS transistor N1 of the first pair of transistors 711 and the PMOS transistor P3 of the third pair of transistors 713 may be coupled at the second storage node SN2. The next one of the last pair of transistors 716 may be the first pair of transistors 711. Similarly, the previous one of the first pair of transistors 711 may be the last pair of transistors 716.

The initialization unit 720 and the data input control unit 730 may be the same as the initialization unit 220 and the data input control unit 230 described above with reference to FIG. 2 except that the initialization unit 720 and the data input control unit 730 are driven for the added storage nodes SN5 and SN6.

The latch circuit illustrated in FIG. 7 may be resistant to soft errors caused by alpha particle collision or cosmic ray incidence. As long as data of three or more nodes among the storage nodes SN1 to SN6 are not changed at the same time, the data stored in the latch circuit may be maintained without errors. Thus, the latch circuit may be more robust and resistant to soft errors than the latch circuit described above with reference to FIG. 2.

Figure 8:
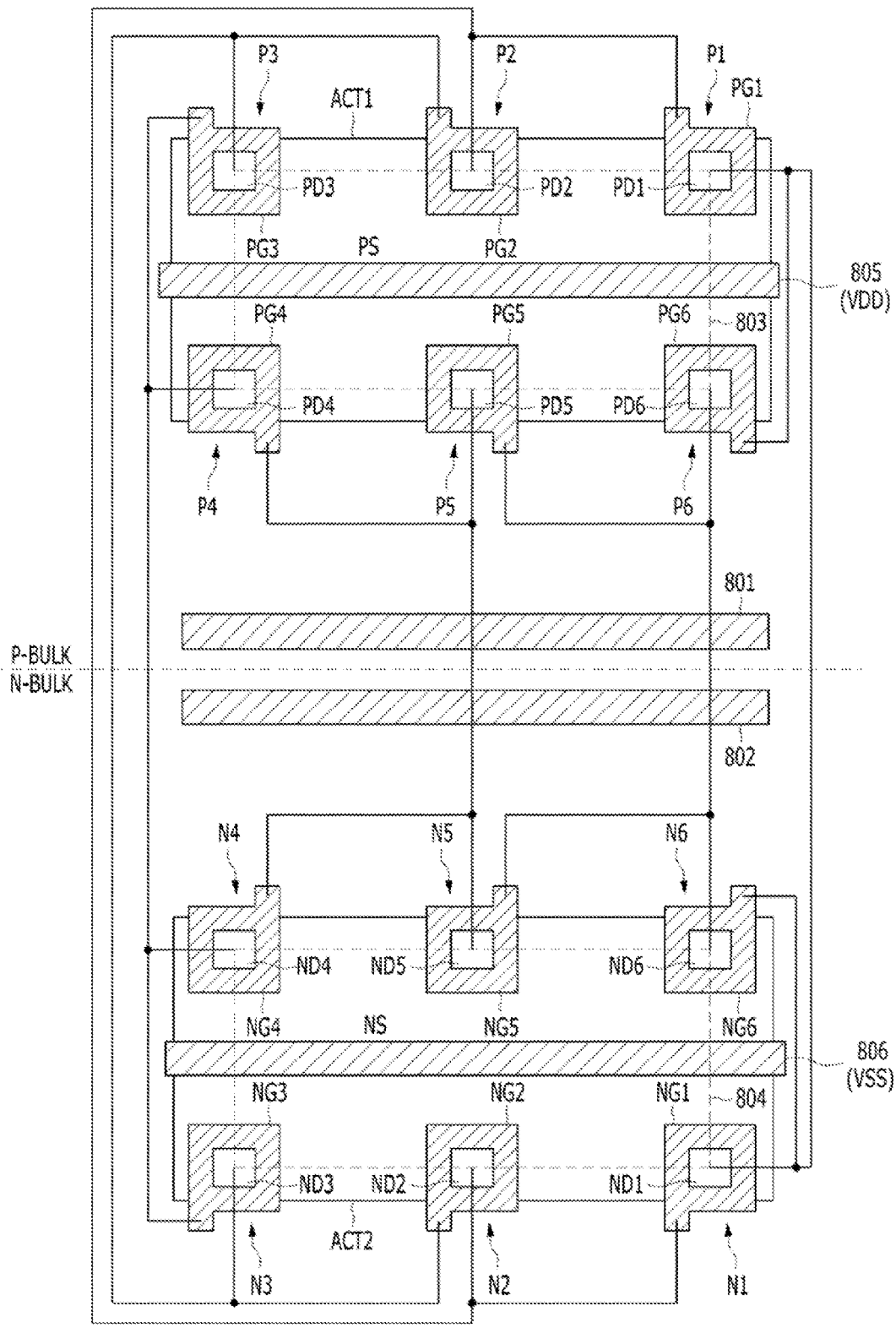
FIG. 8 is a layout exemplarily illustrating transistors P1 to P6 and N1 to N6 in a latch circuit of FIG. 7.

FIG. 8 is a layout exemplarily illustrating the transistors P1 to P6 and N1 to N6 in the latch circuit of FIG. 7.

Referring to FIG. 8, the PMOS transistors P1 to P6 may be formed in a first active region ACT1, and the NMOS transistors N1 to N6 may be formed in a second active region ACT2. The first active region ACT1 and the second active region ACT2 may be separated from each other. The first active region ACT1 may be P-bulk doped with a P-type semiconductor, and the second active region ACT2 may be N-bulk doped with an N-type semiconductor. The P-bulk and the N-bulk may receive a power supply voltage VDD or ground voltage VSS through bulk voltage lines 801 and 802, respectively.

The PMOS transistors P1 to P6 may be sequentially arranged in one of the clockwise and counterclockwise directions in the first active region ACT1. The NMOS transistors N1 to N6 may be sequentially arranged in one of the clockwise and counterclockwise directions in the second active region ACT2. FIG. 8 illustrates that the PMOS transistors P1 to P6 are sequentially arranged in the counterclockwise direction in the first active region ACT1 and the NMOS transistors N1 to N6 are sequentially arranged in the clockwise direction in the second active region ACT2.

The PMOS transistors P1 to P6 may be arranged in a polygonal shape, and the NMOS transistors N1 to N6 may be arranged in a polygonal shape. FIG. 8 illustrates that the PMOS transistors P1 to P6 and the NMOS transistors N1 to N6 are arranged in a rectangular shape.

In the first active region ACT1 based on such an arrangement, the PMOS transistors P1 and P2, P2 and P3, P3 and P4, P4 and P5, P5 and P6, or P6 and P1, coupled to storage nodes having different polarities, among the PMOS transistors P1 to P6, may be arranged adjacent to each other, and the PMOS transistors P1 and P5, P2 and P6, P2 and P4, or P3 and P6 coupled to storage nodes having the same polarity may be arranged in a diagonal direction. In the second active region ACT2, the NMOS transistors N1 and N2, N2 and N3, N3 and N4, N4 and N5, N5 and N6, or N6 and N1, coupled to storage nodes having different polarities, among the NMOS transistors N1 to N6, may be arranged adjacent to each other, and the NMOS transistors N1 and N5, N2 and N6, N2 and N4, or N3 and N6 coupled to storage nodes having the same polarity may be arranged in a diagonal direction.

The PMOS transistors P1 to P6 arranged in the first active region ACT1 may share a single node to which a power supply voltage VDD is applied. In the first active region ACT1, the power supply voltage VDD may be applied to the part PS shared by the PMOS transistors P1 to P6 through a power supply voltage line 805. The NMOS transistors N1 to N6 arranged in the second active region ACT2 may share a single node to which a ground voltage VSS is applied. In the second active region ACT2, the ground voltage VSS may be applied to the part NS shared by the NMOS transistors N1 to N6 through a ground voltage line 806.

The gates PG1 to PG6 and NG1 to NG6 of the transistors may have various shapes as described above with reference to FIGS. 4 and 5.

The drain PD1 of the transistor P1, the drain ND1 of the transistor N1, the gate PG2 of the transistor P2, and the gate NG6 of the transistor N6 may be coupled to each other. The drain PD2 of the transistor P2, the drain ND2 of the transistor N2, the gate PG3 of the transistor P3, and the gate NG1 of the transistor N1 may be coupled to each other. The drain PD3 of the transistor P3, the drain ND3 of the transistor N3, the gate PG4 of the transistor P4, and the gate NG2 of the transistor N2 may be coupled to each other. The drain PD4 of the transistor P4, the drain ND4 of the transistor N4, the gate PG5 of the transistor P5, and the gate NG3 of the transistor N3 may be coupled to each other. The drain PD5 of the transistor P5, the drain ND5 of the transistor N5, the gate PG6 of the transistor P6, and the gate NG4 of the transistor N4 may be coupled to each other. The drain PD6 of the transistor P6, the drain ND6 of the transistor N6, the gate PG1 of the transistor P1, and the gate NG5 of the transistor N5 may be coupled to each other.

The latch circuit of FIG. 8 may also be resistant to soft errors through the arrangement of the transistors P1 to P6 and N1 to N6, using the self-canceling effect described with reference to FIG. 6.

Figure 9:
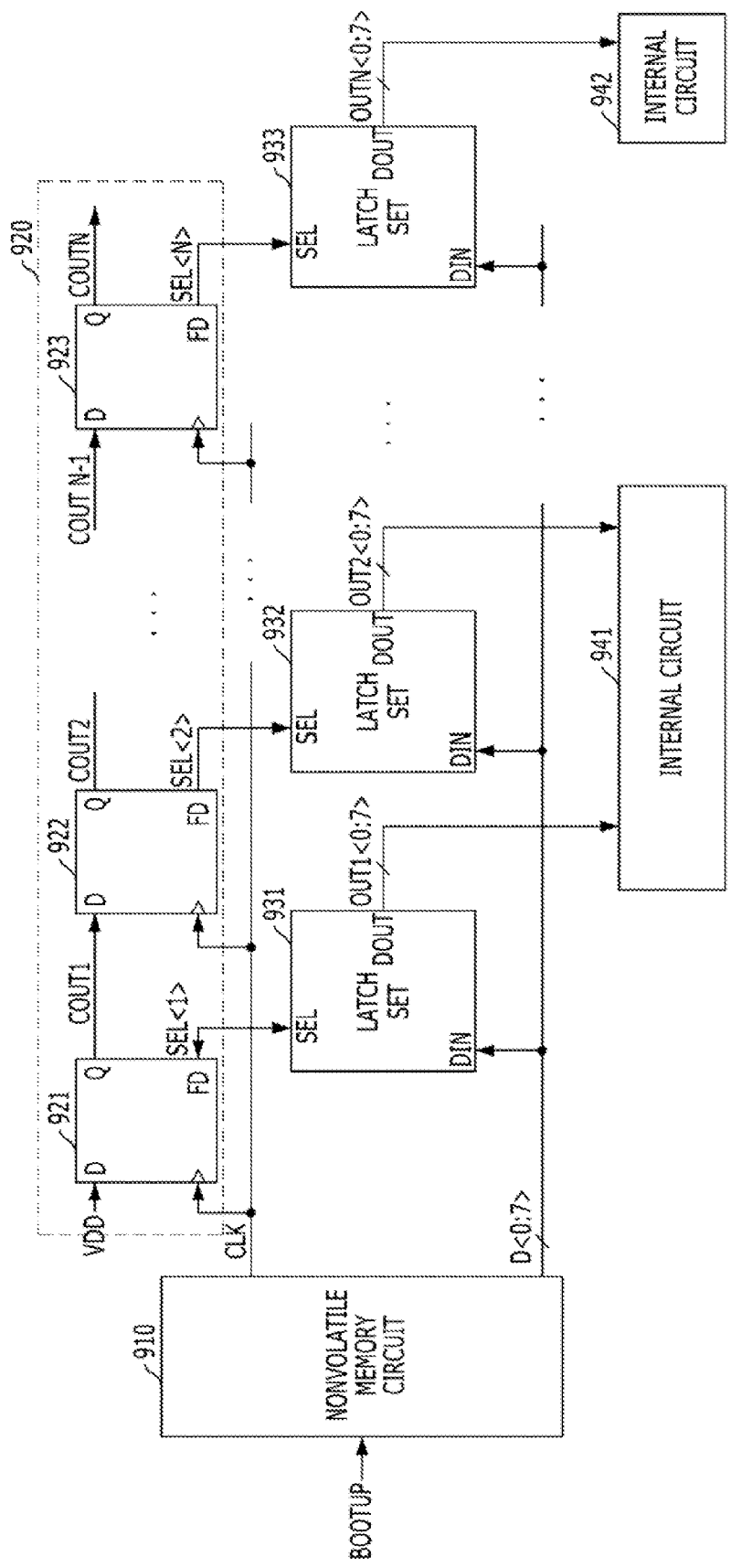
FIG. 9 is a block diagram exemplarily illustrating a semiconductor device in accordance with an embodiment of the present invention.

FIG. 9 is a block diagram exemplarily illustrating a semiconductor device in accordance with an embodiment of the present invention. The semiconductor device may include one of various types of integrated circuit chips, such as a memory device, CPU, and various control chips.

Referring to FIG. 9, the semiconductor device may include a nonvolatile memory circuit 910, a data bus D<0:7>, a selection signal generation unit 920, latch sets 931 to 933, and internal circuits 941 and 942.

The nonvolatile memory circuit 910 may store information for the internal circuits 941 and 942 of the semiconductor device. The nonvolatile memory circuit 910 may sequentially output all data stored therein to the data bus D<0:7> in response to a boot-up signal BOOTUP. A clock CLK outputted from the nonvolatile memory circuit 910 may be synchronized with the data transmitted through the data buses D<0:7>. The nonvolatile memory circuit 910 may be one among an e-fuse array circuit, a NAND flash memory, a NOR flash memory, an Erasable Programmable Read Only Memory (EPROM), an Electrically Erasable Programmable Read Only Memory (EEPROM), a Ferroelectric Random Access Memory (FRAM) and a Magnetoresistive Random Access Memory (MRAM).

The selection signal generation unit 920 may generate a plurality of selection signals SEL<1:M>. The selection signal generation unit 920 may sequentially enable the plurality of selection signals SEL<1:M> using the clock CLK, whenever the clock CLK is enabled. For example, when a selection signal SEL<X>, where X is an integer ranging from 1 to M, is currently enabled in response to the current enablement of the clock CLK, a selection signal SEL<X+1> may be enabled in response to the next enablement of the clock CLK, next time. The selection signal generation unit 920 may include N number of flip-flop circuits 921 to 923. Each of the flip-flop circuits 921 to 923 may shift a signal inputted to a node D by one clock period in synchronization with the clock CLK, and output the shifted signal to a node Q. Furthermore, the flip-flop circuits 921 to 923 may generate the selection signals SEL<1:N> based on the signals inputted to the node D thereof, and output the generated selection signals SEL<1:N> through nodes FD thereof, respectively. The flip-flop circuits 921 to 923 may be coupled in series. That is, an output signal Q of the current flip-flop circuit may serve as an input signal D of the next flip-flop circuit. The first flip-flop circuit 921 among the flip-flop circuits 921 to 923 may receive a power supply voltage VDD as an input signal.

The latch sets 931 to 933 may receive and store the data transferred through the data bus D<0:7> when the corresponding selection signals among the selection signals SEL<1:N> are enabled. Each of the latch sets 931 to 933 may include a plurality of latch circuits corresponding to the bit-width of the data bus D<0:7> in order to store data corresponding to the bit-width of the data bus D<0:7>. For example, each of the latch sets 921 to 923 may include eight latch circuits for an 8 bit-width data bus D<0:7>. The latch sets 931 to 933 may provide the data stored therein to the internal circuits 341 and 342 through output lines OUT1<0:7> to OUTN<0:7>. The latch sets 931 to 933 may share the data bus D<0:7> transferring the data for each of the latch sets 931 to 933 while each of the latch sets 931 to 933 may have a dedicated output line among the data output lines OUT1<0:7> to OUTN<0:7>, through which the corresponding one of the latch sets 931 to 933 outputs the stored data. The details of the latch sets 931 to 933 will be described with reference to the drawing.

The internal circuits 941 and 942 may use the information stored in the latch sets 931 to 933. For example, the internal circuit 941 may set internal voltages for the semiconductor device based on the information stored in the latch sets 931 and 932, and the internal circuit 942 may repair a failure of the semiconductor device based on the information stored in the latch set 933.

In accordance with the embodiment of FIG. 9, during the boot-up operation of transmitting data of the nonvolatile memory circuit 910 to the plurality of latch sets 931 to 933, the selection signals SEL<1:N> may be generated by the selection signal generation unit 920 using the clock CLK, and data of the data bus D<0:7> may be stored in the latch sets 931 to 933 corresponding to an enabled selection signal. That is, a simple scheme for selecting one of the latch sets 931 to 933 to store the data outputted from the non-volatile memory circuit 910 is adopted, and consequently the number of lines between the non-volatile memory circuit 910 and the latch sets 931 to 933 and the time required for the boot-up operation may be minimized.

Figure 10:
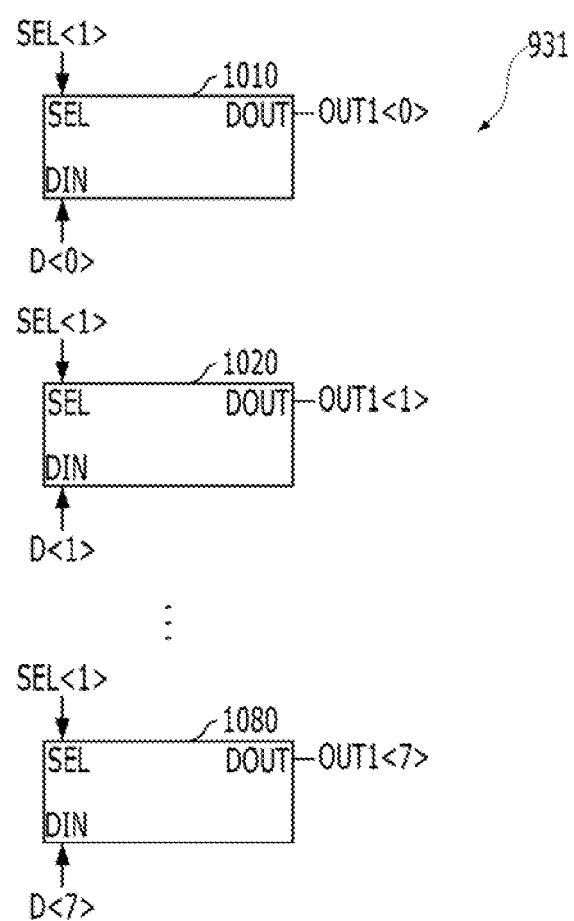
FIG. 10 is a block diagram exemplarily illustrating a latch set of FIG. 9.

FIG. 10 is a block diagram exemplarily illustrating the latch set 931 of FIG. 9. Each of the other latch sets 932 and 933 shown in FIG. 9 may be the same as the latch set 931 shown in FIG. 10.

Referring to FIG. 10, the latch set 931 may include eight latch circuits 1010 to 1080 corresponding to the bit-width of the data bus D<0:7>. The same signal may be inputted to each SEL node of the latch circuits 1010 to 1080. Each of the latch circuits 1010 to 1080 may receive and output corresponding data transferred from the data bus D<0:7> through DIN and DOUT nodes thereof. In other words, the latch circuits 1010 to 1080 inside the same latch set 931 may share the selection signal SEL<1> with each other while they may receive different data loaded on the data bus D<0:7> and have different outcomes.

The latch circuits 1020 to 1080 may be the same as described above with reference to FIGS. 2 and 7. The configuration and arrangement of the transistors included in the latch circuits 1010 to 1080 may be the same as described above with reference to FIGS. 4, 5, and 8.

In accordance with the embodiments of the present invention, it is possible to increase soft error resistance in latch circuits and semiconductor devices through the shapes and arrangements of transistors.

Although various embodiments have been described for illustrative purposes, it will be apparent to those skilled in the art that various changes and modifications may be made without departing from the spirit and scope of the invention as defined in the following claims.

What is claimed is:
1. A latch circuit comprising:
    first to fourth storage nodes; and
    first to fourth pairs of transistors, each of which comprises a PMOS transistor and an NMOS transistor coupled in series with each other through a corresponding node among the first to fourth storage nodes,
    wherein the PMOS transistor is coupled to one of the storage nodes included in a previous one of the pairs of transistors at a gate of the PMOS transistor,
    wherein the NMOS transistor is coupled to one of the storage nodes included in a next one of the pairs of transistors at a gate of the NMOS transistor,
    wherein the PMOS transistors of the first to fourth pairs of transistors are formed in a first active region,
    wherein the NMOS transistors of the first to fourth pairs of transistors are formed in a second active region, separated from the first active region,
    wherein the PMOS transistors of the first to fourth pairs of transistors are sequentially arranged at each corner of a rectangle formed in the first active region that is a single region, and
    wherein the NMOS transistors of the first to fourth pairs of transistors are sequentially arranged at each corner of a rectangle formed in the second active region that is a single region.

2. The latch circuit of claim 1,
    wherein the PMOS transistors of the first to fourth pairs of transistors are arranged in such a manner that the PMOS transistors coupled to the storage nodes having different polarities are positioned adjacent to each other, and
    wherein the NMOS transistors of the first to fourth pairs of transistors are arranged in such a manner that the NMOS transistors coupled to the storage nodes having different polarities are positioned adjacent to each other.

3. The latch circuit of claim 1,
    wherein the PMOS transistors of the first and third pairs of transistors are arranged in a diagonal direction, the PMOS transistors of the second and fourth pairs of transistors are arranged in a diagonal direction, and the PMOS transistors of the first and third pairs of transistors and the PMOS transistors of the second and fourth pairs of transistors are arranged adjacent to each other, and
    wherein the NMOS transistors of the first and third pairs of transistors are arranged in a diagonal direction, the NMOS transistors of the second and fourth pairs of transistors are arranged in a diagonal direction, and the NMOS transistors of the first and third pairs of transistors and the NMOS transistors of the second and fourth pairs of transistors are arranged adjacent to each other.

4. The latch circuit of claim 1, wherein each of the PMOS and NMOS transistors has a gate formed in a ring shape or U-shape.

5. The latch circuit of claim 1,
    wherein each of the PMOS transistors has a gate which divides the first active region into two regions, and
    wherein each of the NMOS transistors has a gate which divides the second active region into two regions.

6. The latch circuit of claim 1,
    wherein the first active region is doped with a P-type semiconductor, and
    wherein the second active region is doped with an N-type semiconductor.

7. The latch circuit of claim 1,
    wherein two or more nodes among the first to fourth storage nodes are driven to receive data, and
    wherein data are outputted through a data line coupled to one or more nodes among the first to fourth storage node.

8. A latch circuit comprising:
    first to fourth PMOS transistors sequentially arranged in a first active region; and
    first to fourth NMOS transistors sequentially arranged in a second active region, separated from the first active region,
    wherein a Kth PMOS transistor and a Kth NMOS transistor are coupled in series to each other, and a node coupled to the Kth PMOS and NMOS transistors is coupled to the gate of a (K−1)th NMOS transistor and the gate of a (K+1) PMOS transistor, where 1≤K≤4,
    wherein the first to fourth PMOS transistors are sequentially arranged at each corner of a rectangle formed in the first active region that is a single region, and
    wherein the first to fourth NMOS transistors are sequentially arranged at each corner of a rectangle formed in the second active region that is a single region.

9. The latch circuit of claim 8,
wherein a node coupled to the first PMOS and NMOS transistors is coupled to the gate of the fourth NMOS transistor and the gate of the second PMOS transistor, and
wherein a node coupled to the fourth PMOS and NMOS transistors is coupled to the gate of the (N−1)th transistor and the gate of the first PMOS transistor.

10. The latch circuit of claim 8, wherein each of the first to fourth PMOS transistors and the first to fourth NMOS transistors has a gate formed in a ring shape or U-shape.

11. The latch circuit of claim 8,
wherein each of the first to fourth PMOS transistors has a gate which divides the first active region into two regions, and
wherein each of the first to fourth NMOS transistors has a gate which divides the second active region into two regions.

12. A latch circuit comprising:
first to fourth PMOS transistors sequentially arranged at each corner of a rectangle formed in a first active region that is a single region; and
first to fourth NMOS transistors sequentially arranged at each corner of a rectangle formed in a second active region that is a single region, separated from the first active region,
wherein the first and third PMOS transistors and the first and third NMOS transistors are arranged in diagonal directions, respectively,
wherein a Kth PMOS transistor and a Kth NMOS transistor are coupled in series to each other, and
wherein a node coupled to the Kth PMOS and NMOS transistors is coupled to a gate of a (K−1)th NMOS transistor and a gate of a (K+1)th PMOS transistor, where 1≤K≤4.

13. The latch circuit of claim 12,
wherein a node coupled to the first PMOS and NMOS transistors is coupled to the gate of the fourth NMOS transistor and the gate of the second PMOS transistor, and
wherein a node coupled to the fourth PMOS and NMOS transistors is coupled to the gate of the third NMOS transistor and the gate of the first PMOS transistor.

14. The latch circuit of claim 12,
wherein each of the first to fourth PMOS transistors has a gate which divides the first active region into two regions, and
wherein each of the first to fourth NMOS transistors has a gate which divides the second active region into two regions.

15. A semiconductor device comprising:
a nonvolatile memory unit;
a data bus suitable for transmitting data outputted from the nonvolatile memory unit;
a selection signal generation unit suitable for generating a plurality of selection signals; and
a plurality of latch sets activated in response to corresponding selection signals among the plurality of selection signals, suitable for storing data transmitted to the data bus, and each comprising a plurality of latch circuits,
wherein each of the latch circuits comprises:
first to fourth storage nodes; and
first to fourth pairs of transistors, each of which comprises a PMOS transistor and a NMOS transistor coupled in series with each other through a corresponding node of the first to fourth storage nodes,
wherein the PMOS transistor is coupled to one of the storage nodes included in a previous one of the pairs of transistors at a gate of the PMOS transistor,
wherein the NMOS transistor is coupled to one of the storage nodes included in a next one of the pairs of transistors at a gate of the NMOS transistor,
wherein the PMOS transistors of the first to fourth pairs of transistors are formed in a first active region, and
wherein the NMOS transistors of the first to fourth pairs of transistors are formed in a second active region, separated from the first active region,
wherein the PMOS transistors of the first to fourth pairs of transistors are sequentially arranged at each corner of a rectangle formed in the first active region that is a single region, and
wherein the NMOS transistors of the first to fourth pairs of transistors are sequentially arranged at each corner of a rectangle formed in the second active region that is a single region.

16. The semiconductor device of claim 15,
wherein the PMOS transistors of the first to fourth pairs of transistors are arranged in such a manner that the PMOS transistors coupled to the storage nodes having different polarities are positioned adjacent to each other, and
wherein the NMOS transistors of the first to fourth pairs of transistors are arranged in such a manner that the NMOS transistors coupled to the storage nodes having different polarities are positioned adjacent to each other.

17. The semiconductor device of claim 15,
wherein each of the PMOS transistors has a gate which divides the first active region into two regions, and
wherein each of the NMOS transistors has a gate which divides the second active region into two regions.

18. The semiconductor device of claim 15, wherein the selection signal generation unit changes an enabled selection signal among the plurality of selection signals whenever a clock is enabled.

19. The semiconductor device of claim 15, further comprising a memory bank suitable for replacing normal cells with redundancy cells using the data stored in the plurality of latch sets.

* * * * *